United States Patent
Takahashi et al.

(10) Patent No.: US 7,715,869 B2
(45) Date of Patent: May 11, 2010

(54) SEMICONDUCTOR INTEGRATED CIRCUIT DEVICE

(75) Inventors: Satoru Takahashi, Takasaki (JP); Ikuya Ohno, Takasaki (JP); Norio Hayashi, Tamamura (JP); Masachika Ohno, Takasaki (JP); Kazuhiro Tagawa, Tamamura (JP)

(73) Assignees: Hitachi, Ltd., Tokyo (JP); Akita Electronics Systems Co., Ltd., Akita (JP)

( * ) Notice: Subject to any disclaimer, the term of this patent is extended or adjusted under 35 U.S.C. 154(b) by 1323 days.

(21) Appl. No.: 10/653,901

(22) Filed: Sep. 4, 2003

(65) Prior Publication Data

US 2004/0051122 A1    Mar. 18, 2004

(30) Foreign Application Priority Data

Sep. 13, 2002    (JP)    ............................. 2002-267494

(51) Int. Cl.
  *H04M 1/00*    (2006.01)
(52) U.S. Cl. .................................... 455/552.1; 455/303
(58) Field of Classification Search ................ 455/131, 455/313, 323, 333, 334, 552.1, 553.1, 550.1, 455/551, 554.2, 556.1, 296, 303, 304, 305, 455/311
See application file for complete search history.

(56) References Cited

U.S. PATENT DOCUMENTS

| | | | | |
|---|---|---|---|---|
| 3,963,990 A | * | 6/1976 | DiFonzo | ..................... 455/304 |
| 5,280,292 A | * | 1/1994 | Tondryk | ..................... 342/373 |
| 5,430,247 A | * | 7/1995 | Bockelman | ................... 174/33 |
| 5,475,643 A | | 12/1995 | Ohta | |
| 5,650,971 A | * | 7/1997 | Longway et al. | ............. 365/207 |
| 5,819,169 A | * | 10/1998 | Fudem | ........................ 455/326 |
| 5,903,835 A | * | 5/1999 | Dent | ........................... 455/427 |
| 6,005,265 A | | 12/1999 | Kuroda | |
| 6,091,963 A | * | 7/2000 | Mannerstråle et al. | ... 455/552.1 |
| 6,269,253 B1 | | 7/2001 | Maegawa et al. | |
| 6,292,654 B1 | * | 9/2001 | Hessel et al. | ................. 455/223 |
| 6,725,029 B1 | * | 4/2004 | Allen | ......................... 455/302 |
| 6,735,426 B1 | * | 5/2004 | Pau | ............................. 455/255 |
| 6,917,815 B2 | * | 7/2005 | Hajimiri et al. | .......... 455/552.1 |
| 7,050,779 B2 | * | 5/2006 | Ono et al. | .................... 455/333 |
| 7,079,400 B2 | * | 7/2006 | Inamoto et al. | ............. 361/778 |
| 7,139,547 B2 | * | 11/2006 | Wakayama et al. | ......... 455/333 |
| 7,155,184 B2 | * | 12/2006 | Kim | .......................... 455/205 |
| 7,263,343 B2 | * | 8/2007 | Mitsunaka et al. | .......... 455/292 |
| 7,280,808 B2 | * | 10/2007 | Murray et al. | ........... 455/114.2 |
| 7,333,565 B2 | * | 2/2008 | Oono et al. | .................. 375/307 |
| 2001/0021645 A1 | * | 9/2001 | Ugajin et al. | ............... 455/333 |

(Continued)

FOREIGN PATENT DOCUMENTS

JP    62-274764 A    11/1987

(Continued)

*Primary Examiner*—Edward Urban
*Assistant Examiner*—RuiMeng Hu
(74) *Attorney, Agent, or Firm*—Mattingly & Malur, P.C.

(57) ABSTRACT

The semiconductor integrated circuit (RF IC) for a mobile telephone capable of transmitting/receiving the signals of plural bands reduces the DC offsets of the amplifiers located in the following stages of the mixers that demodulate or down-convert the reception signals. The invention scrambles the signal lines to transmit the outputs of the plural mixers that demodulate or down-convert the reception signals of different bands, so as to avoid the adjacent signal lines from making the same combination from the starting ends to the finishing ends.

2 Claims, 7 Drawing Sheets

U.S. PATENT DOCUMENTS

| | | | |
|---|---|---|---|
| 2003/0045263 A1* | 3/2003 | Wakayama et al. | 455/323 |
| 2004/0043727 A1* | 3/2004 | Sato | 455/102 |
| 2004/0043740 A1* | 3/2004 | Magnusen et al. | 455/307 |
| 2004/0166799 A1* | 8/2004 | Kral | 455/3.02 |
| 2007/0021076 A1* | 1/2007 | Tanaka et al. | 455/118 |
| 2007/0117507 A1* | 5/2007 | Wakayama et al. | 455/3.02 |

FOREIGN PATENT DOCUMENTS

| | | |
|---|---|---|
| JP | 3-171662 A | 7/1991 |
| JP | 10-107208 A | 4/1998 |
| JP | 11-103325 A | 4/1999 |
| JP | 2001-509994 A | 7/2001 |
| WO | 98/32235 A2 | 7/1998 |

* cited by examiner

DC COMPONENTS

DC COMPONENTS
DC OFFSET

SEMICONDUCTOR INTEGRATED CIRCUIT DEVICE

BACKGROUND OF THE INVENTION

The present invention relates to a technique effective in application for the wirings that transmit to the following stage amplifier the output of a mixer of the direct down-conversion system that synthesizes a reception signal and an oscillation signal of a predetermined frequency to produce a frequency-converted signal, in a semiconductor integrated circuit used in a radio communication system; especially, it relates to a technique effective in use for a semiconductor integrated circuit having a function that modulates/demodulates a transmission/reception signal, which is used in a radio communication system capable of transmitting/receiving signals of plural bands.

A radio communication system such as a mobile telephone generally uses a VCO (Voltage Controlled Oscillator) that generates an oscillation signal of a predetermined frequency that is synthesized with a reception signal or a transmission signal. Some of the conventionally proposed mobile telephones take on the so-called dual band system that can handle the signals of two frequency bands such as the GSM (Global System For Mobile Communication) of 880 to 915 MHz band and the DCS (Digital Cellular System) of 1710 to 1785 MHz band.

In recent years, there appears a demand for the triple band system that can handle the signal of the PCS (Personal Communication System) of 1850 to 1915 MHz band, in addition to the GSM and DCS. It is also conceivable that there will increase a demand for a mobile telephone capable of handling more bands.

SUMMARY OF THE INVENTION

In view of reducing the number of components, the direct conversion system is effective for an RF IC used in the mobile telephone that can handle such plural bands. On the other hand, the mobile telephone generally uses a SAW (Surface Acoustic Wave) filter with a sharp frequency characteristic, in order to branch the reception signal of a desired frequency band. However, the SAW filter has a narrow pass band, and the existing SAW filter is not furnished with such a mechanism that can vary the pass band. Accordingly, the mobile telephone capable of handling plural bands is furnished with plural SAW filters that have different frequency bandwidths for each of the bands. In correspondence with the plural SAW filters, the RF IC of the direct conversion system provides the bands each with plural mixers that mix the reception signals and the local oscillation signals to make frequency-converted signals.

With regard to this, the following stage circuit such as a gain control amplifier that amplifies the frequency-converted signals by the mixers or a noise eliminating lowpass filter is frequently provided as a common circuit for the plural bands. The frequency of the frequency-converted signals by the mixers is limited within a certain range, and in addition, the RF IC will not simultaneously handle the signals of plural bands. Therefore, to commonly use the circuit for the plural bands will reduce the occupancy area of circuit, and shrink the chip size of the RF IC.

FIG. 2 illustrates a reception circuit of the direct conversion system for triple bands, which the present inventor examined. In the drawing, the symbols 120a, 120b, and 120c signify the SAW filters that eliminate spurious waves from the reception signal, and each pass the signal of the GMS frequency band, the signal of the DCS frequency band, and the signal of the PCS frequency band. The symbols 210a, 210b, and 210c signify the low noise amplifiers that amplify the signals having passed through the SAW filters. The symbols MIX 1a, MIX 1b, MIX 2a, MIX 2b, MIX 3a, and MIX 3b signify the mixers that mix the reception signals each with the local oscillation signals $\phi$RF1 and $\phi$RF2 from the RF VCO to produce frequency-converted signals, and at the same time demodulate the frequency-converted signals into I and Q signals. And, the symbols 220A and 220B signify the high gain amplifiers that are composed of the gain control amplifiers to amplify the demodulated signals to a desired level and the low pass filters. The local oscillation signals $\phi$RF1 and $\phi$RF2 have the phase difference of 90° from each other.

In this reception circuit, the positive-phase output terminals of the I signals and Q signals of the mixers MIX 1a through MIX 3b are commonly connected, and the negative-phase output terminals of the same are commonly connected; and capacitors C1 and C2 are externally connected between the positive-phase output terminals and the negative-phase output terminals. Resisters R1 through R4 are connected between the commonly connected output nodes of the mixers MIX 1a through MIX 3b and the ground GND. These elements constitute the low pass filters that remove the frequency components of the reception signals and the local oscillation signals before mixing, which are contained in the outputs of the mixers MIX 1a through MIX 3b, and extract only the signal components having the frequency differences of the reception signals and local oscillation signals.

As seen from FIG. 2, the circuit is configured such that the mixers are provided in correspondence with the number of the bands, and the outputs of the mixers are coupled by wires to be transmitted to the following stage high gain amplifiers 220; accordingly, the lengths of the signal lines L1, L2, L3, and L4 that transmit the signals become longer, as compared to the single band system that only needs one pair of mixers.

The inventor has repeated designs and simulations in order to develop a modulating/demodulating RF IC for the triple-band system mobile telephone, which results in finding out that the triple-band system RF IC generates DC offsets in the gain control amplifiers at the following stages of the mixers. This has not been recognized as a problem, in the single-band system RF IC.

The present invention has been made based on the above novel problem, and an object of the invention is to provide a wiring technique for signal transmission that permits to reduce the DC offsets generated in the amplifiers at the following stages of the mixers that demodulate or down-convert the reception signals, in the semiconductor integrated circuit (RF IC) used for the radio communication system such as a mobile telephone capable of transmitting/receiving plural band signals.

Another object of the invention is to provide a semiconductor integrated circuit for communications that hardly falls into malfunctions.

The above and other objects and novel features of the invention will become apparent from the descriptions and appended drawings of this specification.

The inventor has poured keen efforts over a long period on explicating the cause that generates DC offsets in the gain control amplifiers at the following stages of the mixers of the triple-band system RF IC. As the result, the inventor discovered the fact that, when the signal lines L1, L2, L3, and L4 to couple the outputs of the mixers MIX 1a through MIX 3b are implemented with the wires arranged in parallel to each other, as shown in FIG. 2, and the wiring distance in parallel becomes longer, the cross talks generated by the mutual inductances or parasitic capacitances between the signal lines cause the DC offsets in the gain control amplifiers at the following stages of the mixers.

The reason lies in that the jamming waves contained in the reception signals give influences to the signals supplied to the following stage amplifiers by the mutual inductances or parasitic capacitances between the signal lines from the outputs of the mixers, thus shifting the DC levels. More in detail, it is conceivable that if the wirings of the signals having 180° phase difference are arranged adjacently, as shown in FIG. 8A, the DC components are coincident with the central potential of the waveforms, however, if the phase difference of signals between the adjacent wirings is shifted from 180°, the DC components are also shifted from the central potential of the waveforms, as shown in FIG. 8B, which causes the DC offsets in the following stage gain control amplifiers. When the phase difference of signals between the adjacent wirings is 90', there appears the maximum DC offset.

On the other hand, there is a possibility that the levels of the jamming waves contained in the reception signals become extremely high, as shown by the level of a jamming wave (2) against a desired wave (1) in FIG. 7A. When the reception level of the desired wave is −99 dBm, for example, the level of the jamming wave (±6 MHz from the frequency of the desired wave) is assumed to be −31 dBm, the level of the jamming wave becomes about 2,500-fold against that of the desired wave. This causes a considerably high DC offset.

In the modulating/demodulating RF IC for the multi-band radio communication system according to the invention, the adjacent signal lines of the plural signal lines to transmit the outputs of the plural mixers that demodulate or down-convert the reception signals of different bands are scrambled on the half way, so as not to be arranged in parallel with the same combination from the starting ends to the finishing ends.

According to the above means, the signal lines are scrambled each other, and the influence given by one signal line at a certain position to the other adjacent signal line is given to the same adjacent signal line as a reverse influence at another position, so that the influence is cancelled. This means achieves a semiconductor integrated circuit for communications that prevents generation of the DC offsets in the gain control amplifiers at the following stages of the mixers.

Now, if the number of the signal lines to transmit the outputs of the mixers is given by N, the number of regions or the frequencies of scrambling the signal lines should be N−1. This arrangement will cancel the mutual inductances and cross talks between the signal lines with the minimum scrambling frequency with maximum efficiency.

When the number of the signal lines is N, the number of regions or the frequencies of the scrambling may be N. This will bring the arrangement of the signal lines from the mixer outputs at the finishing ends into the original arrangement at the starting ends, although the arrangement is changed on the way. This facilitates the wiring design and easily grasps the relation of the mixers and the signals in the review of the design or the analysis of malfunctions. Further, by utilizing the existing design resources, only changing the wirings between the mixers and the post-stage circuits will make it possible to cancel the influence by the mutual inductances and cross talks between the signal lines without changing the layout of the other regions at all.

BRIEF DESCRIPTION OF THE DRAWINGS

FIGS. 8A and 8B illustrate waveforms to explain the reason why the phase difference between the signals of the adjacent wirings generates the DC offset, in which FIG. 8A illustrates a case in which the phase difference between the signals is 180°, and FIG. 8B illustrates a case in which the phase difference between the signals is deviated from 180°.

DETAILED DESCRIPTIONS OF THE PREFERRED EMBODIMENTS

The preferred embodiments will be described with reference to the accompanying drawings.

Figure 1:
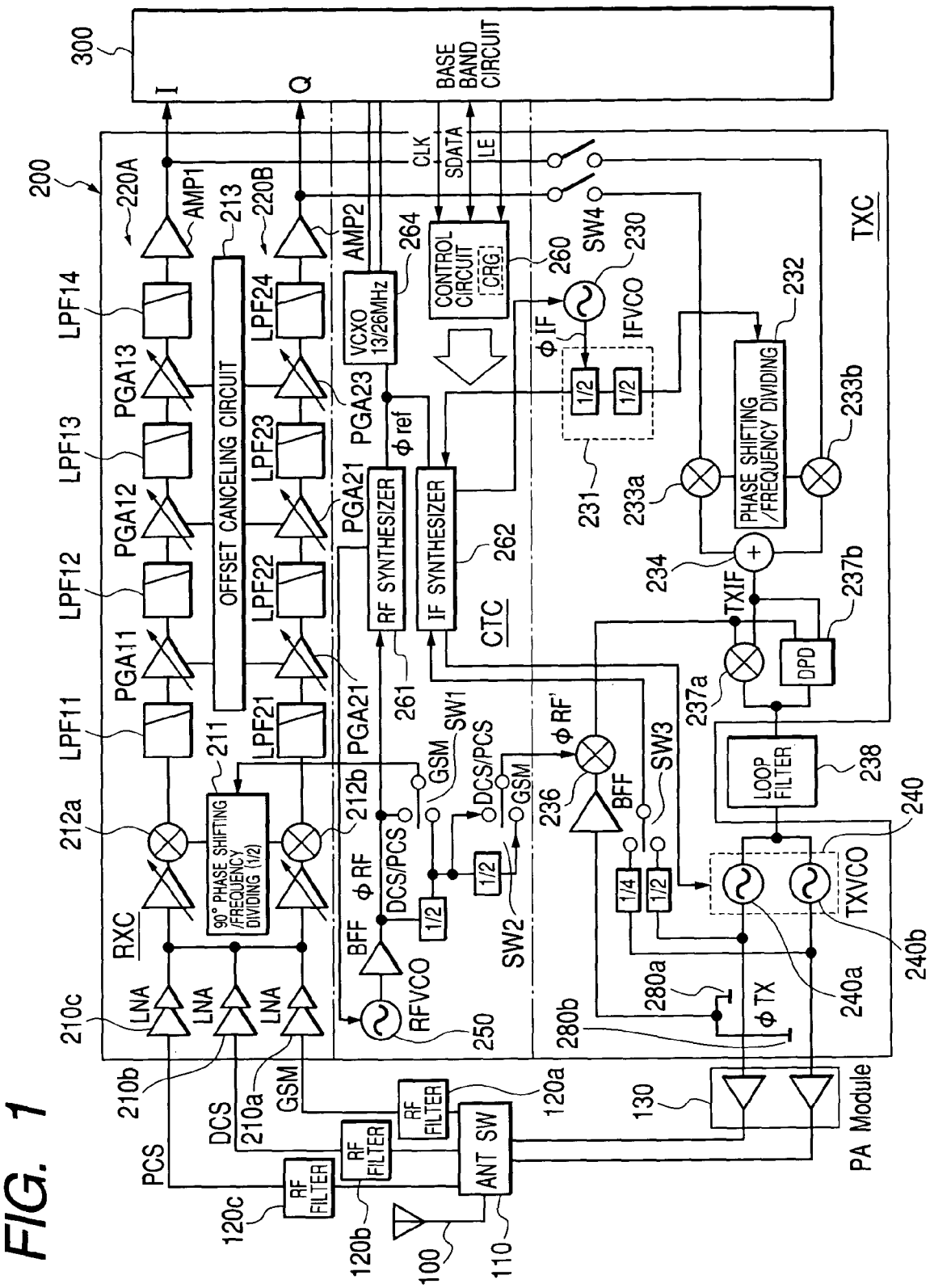
FIG. 1 is a block diagram illustrating a construction of a multi-band system semiconductor integrated circuit (RF IC) to which the invention is applied, and a radio communication system using the same.

FIG. 1 illustrates a construction of a multi-band system semiconductor integrated circuit (RF IC) to which the invention is applied, and a radio communication system using the same.

In FIG. 1, the numeric symbol 100 represents a transmission/reception antenna, 110 a switch for switching transmission/reception, 120a through 120c RF filters composed of SAW filters or the like that eliminate spurious waves from a reception signal, 130 an RF power amplifier that amplifies a transmission signal, 200 an RF IC that demodulates the reception signal, or modulates the transmission signal, 300 a base band circuit that converts transmission data into I and Q signals, or controls the RF IC 200. The RF IC 200 is formed on one semiconductor chip as a semiconductor integrated circuit.

Although not especially restricted, the RF IC 200 is configured to be capable of modulating/demodulating the signals of four frequency bands by the three communication systems of GSM 850 and GSM 900, DCS 1800, and PCS 1900. In order to answer this requirement, the communication system includes the RF filter 120a that passes the reception signal within the frequency hand of the GSM system, the RF filter 120b that passes the reception signal within the frequency hand of the DCS 1800, and the RF filter 120c that passes the reception signal within the frequency hand of the PCS 1900. The frequency band of the GSM 850 is close to that of the GSM 900, and this embodiment uses the common filter 120a.

The RF IC 200 is composed, when it is roughly divided, of a reception system circuit RXC, a transmission system circuit TXC, and a control system circuit CTC shared by the reception system and the transmission system, such as control circuits and clock generators other than the former two.

The reception system circuit RXC includes the low noise amplifiers 210a, 210b, and 210c that amplify the reception signals, a phase shifting/frequency dividing circuit 211 that frequency-divides an oscillation signal φRF generated by an RF oscillation circuit (RFVCO) 250, and generates orthogonal signals having the phase difference of 90° from each other, demodulation circuits 212a, 212b containing mixers that mix the reception signals amplified by the low noise amplifiers 210a, 210b, and 210c with the orthogonal signals frequency-divided by the phase shifting/frequency dividing circuit 211 to thereby demodulate and down-convert the reception signals, the high gain amplifiers 220A, 220B that output to amplify demodulated I, Q signals to the base band circuit 300, an offset canceling circuit 213 that cancels the input DC offsets of the amplifiers inside the high gain amplifiers 220A, 220B, and so forth.

Here in FIG. 1, the demodulation circuits 212a and 212b are shown as if they are common to each band, which is for the reason of illustration. More in detail, the circuit is provided with the mixers MIX1a, MIX 1b; MIX 2a, MIX 2b; and MIX 3a, MIX 3b corresponding to the low noise amplifiers 210a, 210b, and 210c for the GSM, DCS, and PCS. The orthogonal signals φRF1, φRF2 supplied from the phase shifting/frequency dividing circuit 211, having the phase difference of 90° from each other, are also supplied to each of the mixers as the differential signals φRF1, /φRF1, φRF2, and /φRF2.

The high gain amplifier 220A has a configuration in which plural lowpass filters LPF 11, LPF 12, LPF 13, and LPF 14 and gain control amplifiers PGA 11, PGA 12, and PGA 13 are alternately connected in series with a fixed gain amplifier AMP 1 connected at the final stage, and amplifies the I signal to output the result to the base band circuit 300. In the same manner, the high gain amplifier 220B has a configuration in which plural lowpass filters LPF 21, LPF 22, LPF 23, and LPF 24 and gain control amplifiers PGA 21, PGA 22, and PGA 23 are alternately connected in series with a fixed gain amplifier AMP 2 connected at the final stage, and amplifies the Q signal to output the result to the base band circuit 300.

The offset canceling circuit 213 is configured with AD conversion circuits (ADC) that convert the output potential differences of the gain control amplifiers PGA 11, PGA 12, and PGA 13 each with the corresponding input terminals of these amplifiers short-circuited into digital signals, DA conversion circuits (DAC) that generate input offset voltages to bring the corresponding output DC offsets of the gain control amplifiers PGA 11, PGA 12, and PGA 13 into '0' on the basis of the conversion results of these AD conversion circuits, and supply the input offset voltages to the corresponding differential inputs, a control circuit that controls these AD conversion circuits (ADC) and DA conversion circuits (DAC) to execute the offset canceling operation, and so forth.

The transmission system circuit TXC includes an IF oscillation circuit (IFVCO) 230 that generates an oscillation signal φIF of the intermediate frequency, for example, 640 MHz, a frequency dividing circuit 231 that divides the frequency of the oscillation signal φIF generated by the IF oscillation circuit 230 into ¼ the frequency to generate a 160 MHz signal, a phase shifting/frequency dividing circuit 232 that further divides the frequency of the signal frequency-divided by the frequency dividing circuit 231, and generates orthogonal signals having the phase difference of 90° from each other, modulation circuits 233a, 233b that modulate the generated orthogonal signals by the I signal and Q signal supplied from the base band circuit 300, an adder 234 that mixes the modulated signals, an oscillation circuit for transmission (TXVCO) 240 that generates an oscillation signal for transmission φTX of a predetermined frequency, an offset mixer 236 that mixes a feedback signal that the oscillation signal for transmission φTX outputted from the oscillation circuit for transmission (TXVCO) 240 is extracted by couplers 280a, 280b, and the like, and a signal φRF' obtained by frequency-dividing the RF oscillation signal φRF generated by the RF oscillation circuit (RFVCO) 250 as a local oscillator that generates an oscillation signal for frequency conversion, and thereby generates a signal having the frequency that is equivalent to the frequency difference of the above two signals, an analog phase comparator 237a and a digital phase comparator 237b that compare an output from the offset mixer 236 with a signal TXIF synthesized by the adder 234 to detect a phase difference thereof, a loop filter 238 that generates a voltage corresponding to the outputs from the phase comparators 237a, 237b, and so forth.

Here, a resistor and a capacitor constituting the loop filter 238 are connected to the external terminals of the RF IC 200 as the external elements. The oscillation circuit for transmission (TXVCO) 240 is composed of an oscillation circuit 240a that generates a transmission signal for the GSM 850 and GSM 900, and an oscillation circuit 240b that generates a transmission signal for the DCS 1800 and PCS 1900. Thus, the oscillation circuit for transmission (TXVCO) 240 is provided with the two oscillation circuits; the reason is that the frequency coverage of the oscillation circuit 240 is much wider than that of the RF oscillation circuit 250 or that of the IF oscillation circuit 230 for the intermediate frequency, and it is extremely difficult to design an oscillation circuit that covers the whole frequency range by a single circuit.

The reason for providing the analog phase comparator 237a and the digital phase comparator 237b is to accelerate the lock-in operation when the PLL circuit starts operation. Concretely, at the start of transmission, first the phase comparison is carried out by the digital phase comparator 237b, and then it is switched into the phase comparison by the analog phase comparator 237a, which locks the phase loop at a high speed.

Further, the RF IC 200 is provided on the chip thereof a control circuit 260 that controls the whole chip, an RF synthesizer 261 that configures a PLL circuit for RF together with the RF oscillation circuit (RFVCO) 250, an IF synthesizer 262 that configures a PLL circuit for IF together with the IF oscillation circuit (IFVCO) 230, and a reference oscillation circuit (VCXO) 264 that generates a clock signal φref served as the reference signal for the RF synthesizer 261 and the IF synthesizer 262. The synthesizers 261 and 262 each are composed of frequency dividing circuits, phase comparison circuits, charge pump circuits, loop filters, and so forth.

And, since the clock signal φref served as the reference signal is required to have a very high frequency precision, the reference oscillation circuit (VCXO) 264 is connected with an external crystal oscillator. As the frequency of the reference clock signal φref, 26 MHz or 13 MHz, for example, is selected, because a crystal oscillator of such frequency is available at a comparably low cost.

In FIG. 1, the blocks with fractions of ½ and ¼ appended signify frequency dividing circuits, and the symbol BFF signifies a buffer circuit. The symbols SW1, SW2, and SW3 signify the switches for switching the connection for the GSM mode of executing the transmission/reception conforming to the GSM system or the connection for the DCS/PCS mode of executing the transmission/reception conforming to the DCS or PCS system, and selecting the frequency dividing ratios of the transmitted signal. The symbol SW4 signifies the switch subject to the ON/OFF control, in order to supply the I, Q signals from the base band circuit 300 to the modulation circuits 233a and 233b during transmission. These switches SW1 through SW4 are controlled by the signals from the control circuit 260.

The control circuit 260 contains a control register CRG, and the CRG is set on the basis of the signals from the base band circuit 300. Concretely, the base band circuit 300 supplies the RF IC 200 with a clock signal CLK for synchronization, a data signal SDATA, and a load Enable signal LEN for control. Receiving the assertion that the load Enable signal LEN is in the effective level, the control circuit 260 sequentially fetches the data signal SDATA being transmitted form the base band circuit 300 synchronously with the clock signal CLK, and sets the fetched data into the control register CRG. Although it is not restricted, the data signal SDATA is transmitted in serial. The base band circuit 300 is composed of a microprocessor and the like.

Although it is not specifically restricted, the control register CRG is provided with the control bit to start the frequency measurement of the VCO in the RF oscillation circuit (RFVCO) 250 and the IF oscillation circuit (IFVCO) 230, and the bit field to designate the modes such as the reception mode, transmission mode, idling mode, warm-up mode, etc. Here, the idling mode signifies a sleep mode, in which only a very limited part of circuits is in operation during waiting, for example, and the great part of circuits including at least the oscillation circuits are in halt. The warm-up mode is a mode of starting the PLL circuits directly before transmission or reception.

In this embodiment, the phase comparators 237a, 237b, loop filter 238, the oscillation circuits for transmission (TXVCO) 240a, 240b, and the offset mixer 236 constitutes a PLL circuit for transmission (TXPLL) that executes the frequency conversion.

In the multi-band radio communication system of this embodiment, the control circuit 260 changes, according to the instruction from the base band circuit 300, the oscillation signal frequency φRF of the RF oscillation circuit 250 upon transmission and reception corresponding to the channel in use, and switches the SW2 corresponding to the GSM mode or DCS/PCS mode; thereby, the signal frequency supplied to the offset mixer 236 is changed, and the transmission/reception frequency is switched accordingly.

Table 1 illustrates an example of the set frequencies of the oscillation signals φIF, φTX, and φRF of the IF oscillation circuit (IFVCO) 230, oscillation circuit (TXVCO) for transmission 240, and RF oscillation circuit (RFVCO) 250, in the four band RF IC of this embodiment. Here, as for the GSM 850 and GSM 900 in Table 1, since the modulation system and multiplexing system and so forth are the same with the only exception that the frequency band is different, the above two can be regarded as the same communication system.

TABLE 1

|  | IFVCO (MHz) | TXIF (MHz) | TXVCO (MHz) | RFVCO (MHz) | |
|---|---|---|---|---|---|
|  |  |  |  | Upon reception | Upon transmission |
| GSM850 | 640 | 80 | 824 | 3476 | 3616 |
|  | 640 | 80 | 849 | 3576 | 3716 |
| GSM900 | 640 | 80 | 880 | 3700 | 3840 |
|  | 640 | 80 | 915 | 3840 | 3980 |
| DCS1800 | 640 | 80 | 1710 | 3610 | 3580 |
|  | 640 | 80 | 1785 | 3760 | 3730 |
| PCS1900 | 640 | 80 | 1850 | 3860 | 3860 |
|  | 640 | 80 | 1910 | 3980 | 3980 |

As illustrated in Table 1, the oscillation frequency of that IF oscillation circuit (IFVCO) 230 is set to 640 MHz in all cases of the GSM, DCS, and PCS. The frequency is divided into ⅛ by means of the frequency dividing circuit 231 and phase shifting/frequency dividing circuit 232, whereby the carrier wave (TXIF) of 80 MHz is generated and modulated.

On the other hand, the oscillation frequency of the RF oscillation circuit (RFVCO) 250 is set to different values in the reception mode and the transmission mode. In the transmission mode, the oscillation frequency fRF of the RFVCO 250 is set to 3616-3716 MHz in case of the GSM 850, 3840-3980 MHz in case of the GSM 900, 3610-3730 MHz in case of the DCS, and 3860-3980 MHz in case of the PCS. The frequency is divided into ¼ in case of the GSM, and divided into ½ in case of the DCS and PCS, which is supplied to the offset mixer 236 as the φRF'.

The offset mixer 236 outputs a signal having a frequency equal to the frequency difference (fRF"-fTX) of this φRF' and the oscillation signal for transmission φTX from the oscillation circuit for transmission (TXVCO) 240. The PLL circuit for transmission (TXPLL) operates to bring the frequency difference (fRF"-fTX) of the oscillation signals into coincidence with the frequency of the modulation signal TXIF. In other words, the TXVCO 240 is controlled to oscillate the frequency equal to the difference of the frequency (fRF/4) of the oscillation signal φRF' from the RFVCO 250 and the frequency (fTX) of the modulation signal TXIF. This is the transmission operation in the so-called offset PLL system.

In the reception mode, the oscillation frequency fRF of the RFVCO 250 is set to 3476-3576 MHz in case of the GSM 850, 3700-3840 MHz in case of the GSM 900, 3610-3730 MHz in case of the DCS, and 3860-3980 MHz in case of the PCS. The frequency is divided into ½ in case of the GSM; however, it is supplied to the phase shifting/frequency dividing circuit 211 as it is in case of the DCS and PCS, which is frequency-divided and phase-shifted to be supplied to the mixers 212a, 212b.

The RFVCO 250 is made up with, for example, a Colpitts-type oscillation circuit using an LC resonator, in which a plurality of capacitance elements constituting the LC resonator are provided in parallel each through switching elements. Turning the switching elements selectively ON by means of the band-switching signal switches the connected capacitance elements, namely, the whole capacitance of the LC resonator to thereby switch the oscillation frequency by stages. On the other hand, the RFVCO 250 contains a variable capacitance diode, and the control voltage from the loop filter inside the RF synthesizer 261 varies the capacitance of the variable capacitance diode, and varies the oscillation frequency continuously.

Figure 3:
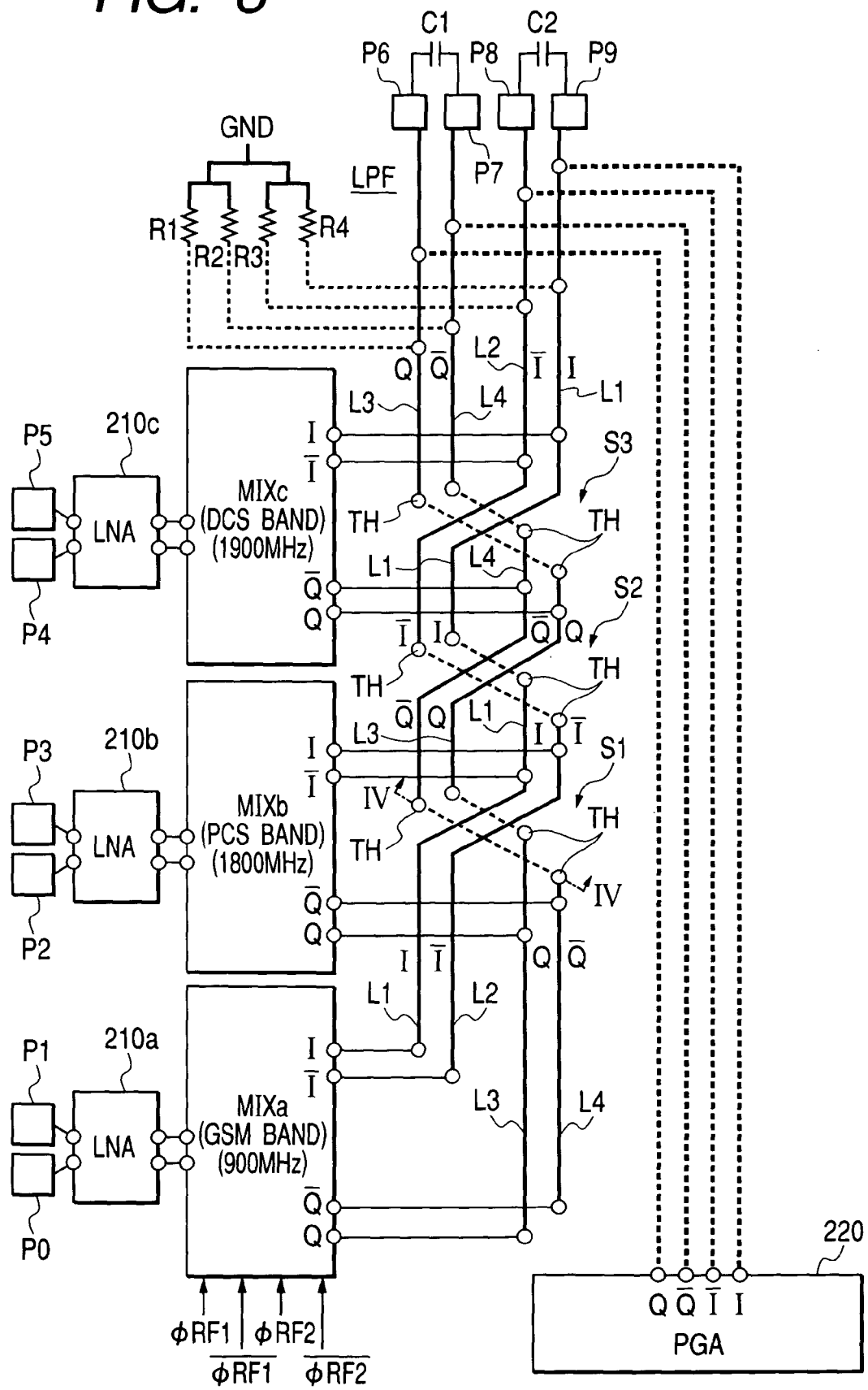
FIG. 3 illustrates a layout of the signal lines that transmit the outputs of the mixers in the reception circuit as shown in FIG. 2 to the post-stage circuits.

Next, the layout of the signal lines that transmit the outputs of the mixers 212a, 212b (MIXa1 through MIXb2) to the high gain amplifiers 220A, 220B of the RF IC 200 in the first embodiment will be described with reference to FIG. 3. In FIG. 3, the same components as shown in FIG. 1 are given the same symbols, and the descriptions thereof will be omitted. The symbols MIXa, MIXb, and MIXc each signify the pairs of mixers: MIXa1 and MIXa2, MIXb1 and MIXb2, and MIXc1 and MIXc2. The symbol 220 illustrates the high gain amplifiers 220A and 220B as one block. The symbols P0 through P9 signify bonding pads as the external terminals.

In this embodiment, the four signal lines that transmit the outputs of the mixers MIXa, MIXb, and MIXc to the high gain amplifiers 220 are formed of wirings L1, L2, L3, and L4, which are scrambled on the half way, as shown in FIG. 3, so as to avoid the wirings for transmitting the different-type signals from being arranged adjacently in parallel from the starting ends to the finishing ends.

Concretely, this embodiment provides three scramble areas S1, S2, and S3, in a manner that the wirings L2 and L3 adjacently run in parallel in the area of MIXa, the wirings L1 and L3 in the next area, the wirings L1 and L4 in the further next area, and the wirings L2 and L4 in the final area.

Figure 4:
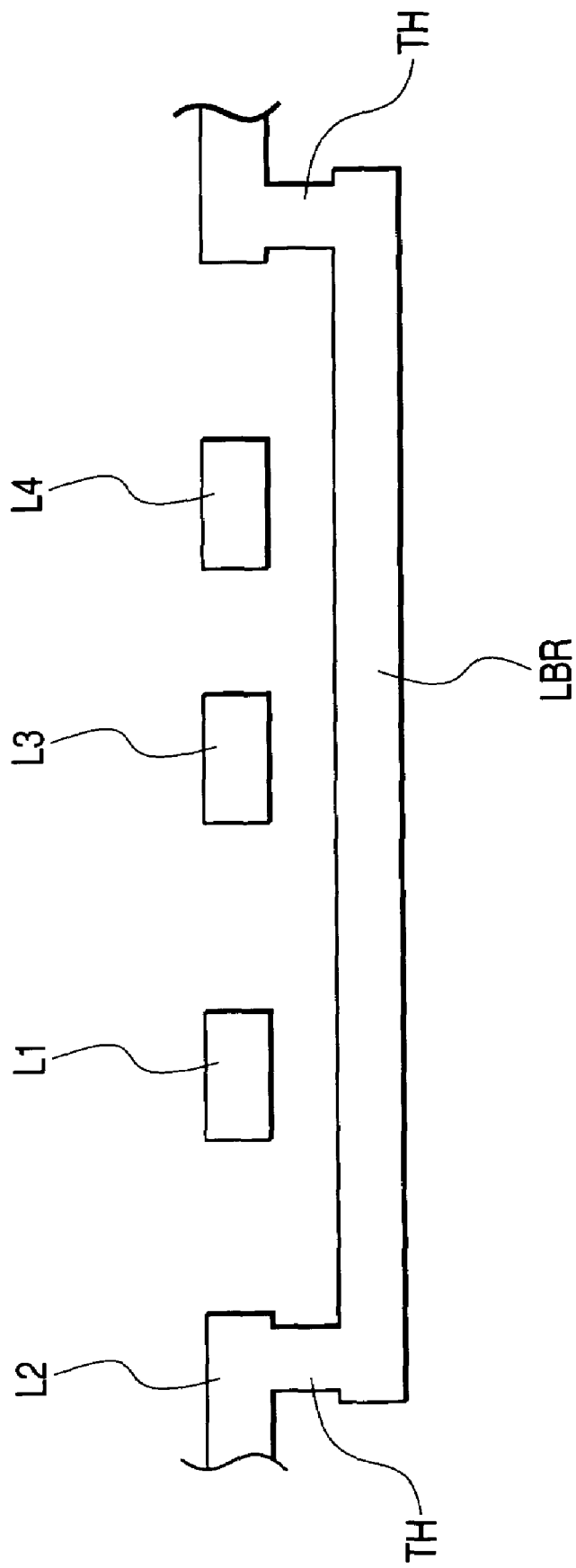
FIG. 4 is a sectional view of the wiring structure, taken on the line IV-IV in FIG. 3.

As the section taken on the line IV-IV in FIG. 3 is illustrated in FIG. 4, in these scramble areas S1 through S3, a bridge wiring LBR is formed in a layer underneath the wirings L1 through L4, in order that the mutually intersecting wirings L1 through L4 will avoid electrical short-circuiting. Thus, one wiring (L2 in FIG. 4) of the four wirings in the upper layer that transmits the same signal is connected with the bridge wiring LBR. The bridge wiring LBR in the lower layer and the wiring L2 in the upper layer are connected by way of a through hole TH formed in an insulating film.

In FIG. 3, the signal lines illustrated by the solid lines signify the wirings in the upper layer, and the signal lines illustrated by the dotted lines signify the wirings in the lower layer. Here, the bridge wiring LBR can be formed in a wiring layer that overlies the wirings L1 through L4. Although not illustrated in FIG. 4, interlayer insulating films are formed surrounding each of the wirings L1 through L4.

As seen from FIG. 3, this embodiment does not provide the scramble areas on the way from the neighboring area of the external terminals P6 through P9 for connecting the external capacitors C1, C2 constituting the low pass filter LPF to the high gain amplifier 220; and the wirings are formed to maintain the same array. The reason is that, since the signals transmitted by the wirings in this area are the low frequency signals that the frequency components contained in the original signals are removed by the low pass filter, the influence by the mutual inductances between the wirings and so forth is very limited. In order to reduce the influence by the mutual inductances between the wirings, the spacings between the wirings from the low pass filter LPF to the high gain amplifier 220 may be expanded sufficiently, or the same scramble areas as those provided from the outputs of the mixer MIX1a to the low pass filter may be provided to the wirings in this area.

As described above, this embodiment provides three scramble areas. In order to cancel the influence between the signal lines in case of four signal lines as the embodiment, it is necessary to scramble the signal lines three times at least. However, following this rule will lead to the result that the array of the signal lines in the final area is different from that in the first area. In the embodiment illustrated in FIG. 3, for example, the array of the signal lines in the first area I, /I, Q, /Q becomes Q, /Q, /I, I in the final area. Now, as it will be described in the next embodiment, if the signal lines are scrambled four times, the array of the signal lines at the finishing ends will recover the original array at the starting ends, although the signal lines from the mixer outputs are scrambled on the way.

Figure 2:
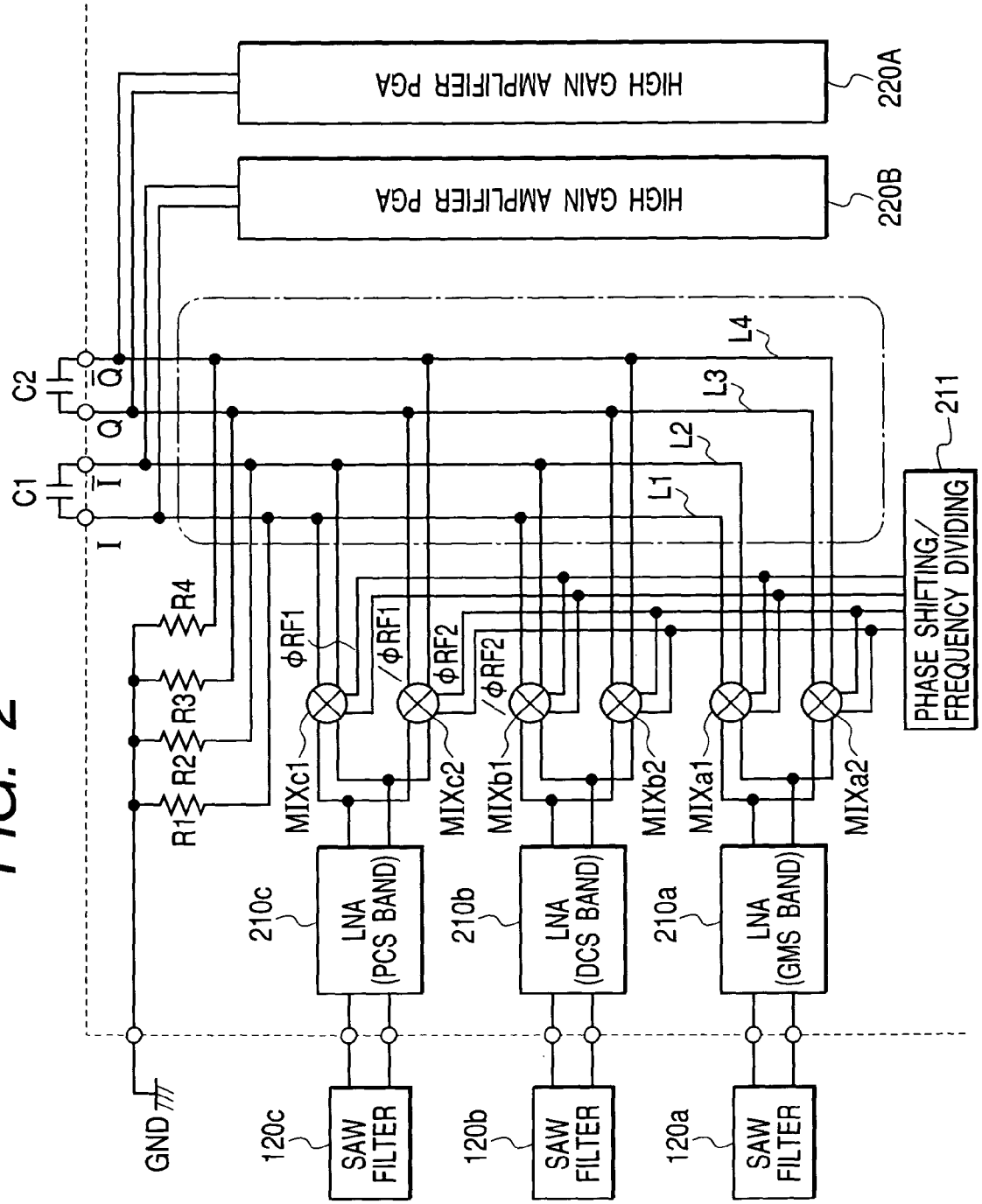
FIG. 2 is a block diagram illustrating one example of a reception circuit for the triple bands.
Figure 5:
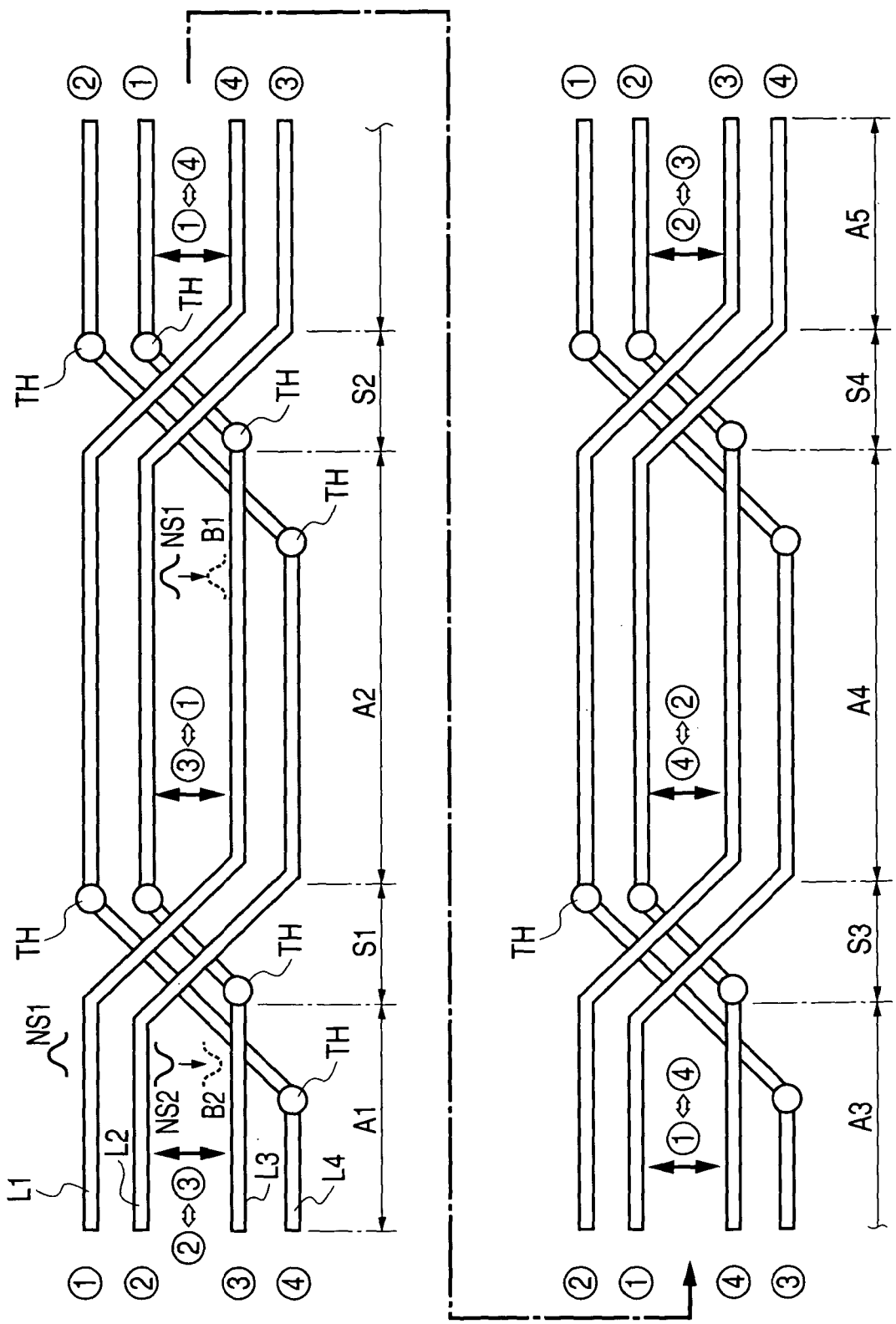
FIG. 5 illustrates another layout of the signal lines that transmit the outputs of the mixers in the reception circuit to the post-stage circuits.

FIG. 5 illustrates the layout of the signal lines in the second embodiment, which transmit the outputs of the mixers 212a, 212b (MIXa1 through MIXb2) to the post-stage high gain amplifiers 220A, 220B. Here, FIG. 2 illustrates with magnification only the surrounded part by the chained-dotted line A in FIG. 2.

As shown in FIG. 5, this second embodiment provides four scramble areas S1, S2, S3, and S4 on the way of the four signal lines L1, L2, L3, and L4 that transmit the outputs of the mixers to the high gain amplifiers. Concretely, this embodiment provides the four scramble areas S1, S2, S3, and S4, in a manner that the wirings L2 and L3 adjacently run in parallel in the area of the symbol A1, the wirings L1 and L3 in the area of the symbol A2, the wirings L1 and L4 in the area of the symbol A3, the wirings L2 and L4 in the area of the symbol A4, and the wirings L2 and L3 again in the final area of the symbol A5.

Thus, scrambling the signal lines four times will make the array of the signal lines at the finishing ends return to the original array at the starting ends, although the signal lines from the mixer outputs are scrambled on the way. Thereby, the wiring designing will become easy, and it will become easy to grasp the relation between the mixers and the signals in reviewing the design or analyzing the malfunctions. On the other hand, if the frequency of scrambling is three times as in the first embodiment of FIG. 3, it is possible to cancel the influence by the mutual inductances and cross talks between the signal lines, with a maximum efficiency and with a minimum frequency of the scrambling.

Now, the function of the scrambling will be described in brief. In FIG. 5, it is assumed that the signal lines L1 and L2 are the wirings that transmit the I signal and /I signal, and the signal lines L3 and L4 are the wirings that transmit the Q signal and /Q signal. Here, the I signal and /I signal are in reverse phase to each other. If the signal line L1 superimposes a noise illustrated by the symbol NS1 on the I signal, the signal line L2 will superimpose a reverse noise illustrated by the symbol NS2 on the /I signal. In the area of A1 in FIG. 5, the wiring L3 runs in parallel adjacently to the wiring L2; accordingly, the Q signal of the wiring L3 has a noise induced by the noise NS2, as shown by the dotted line B2.

Next, with close attention to the area of the symbol A2, since the wiring L1 and the wring L3 run adjacently in parallel in this area, the Q signal of the wiring L3 has a noise induced by the noise NS1 superimposed on the I signal of the wiring L1, as shown by the dotted line B1. As being apparent from observation of the noises B1 and B2, these noises have the same magnitude with reverse phase. Therefore, the noises B1 and B2 are canceled each other on the wiring L3, and the Q signal of the wiring L3 will attain the same result as it is not subjected to the influence from the signals of the wirings L1 and L2. From the same reason, if a DC offset is generated in one adjacent wiring in the area of the symbol A1, a reverse DC offset to the above will be generated in the same wiring in the area of the symbol A2, and these will be canceled each other. That is, this embodiment attains the same result as being immune to the DC components generated in the other adjacent wirings.

When three scramble areas are provided as the four wirings L1 through L4 run adjacently in parallel each one time, as in the embodiment of FIG. 3, the mutual inductances and cross talks between the wirings are canceled each other, and the same result as the influence is not given to each other can be acquired. Further, as in the embodiment of FIG. 5, when the frequency of scrambling is set to four times, which is increased by one time from the embodiment of FIG. 3, the mutual inductances and cross talks between the wirings can be reduced remarkably. Besides, by setting the frequency of scrambling to four times, the finishing ends will recover the original array at the starting ends, although the array of the signal lines from the mixer outputs is scrambled on the way.

Further in FIG. 5, if the wiring configuration is made such that the sum of the length of the area A1 and the length of the area A5 is equal to the length of each of the area A2, A3, and A4, that is, (A1+A5)=A2=A3=A4, even if the frequency of scrambling is set to four times, it will be possible to cancel the influence by the mutual inductances and cross talks between the wirings L1 through L4, and also possible to make the same array at both the starting ends and the finishing ends.

Further, as illustrated in the embodiments of FIG. 3 and FIG. 5, the first and second wirings in the first scramble area are replaced into the third and fourth in the second scramble area, and the third and fourth wirings in the first scramble area are replaced into the second and the first in the second scramble area. Adopting the intersecting system having such regularity will make it possible to make a wiring configuration having the same intersecting structure in all of the scramble areas, in which the signal lines to transmit different signals do not run adjacently in parallel with the same combination from the starting ends to the finishing ends. Thereby, the mask patterns in the scramble areas can be made into one; the designing of the layout becomes simpler.

Figure 6:
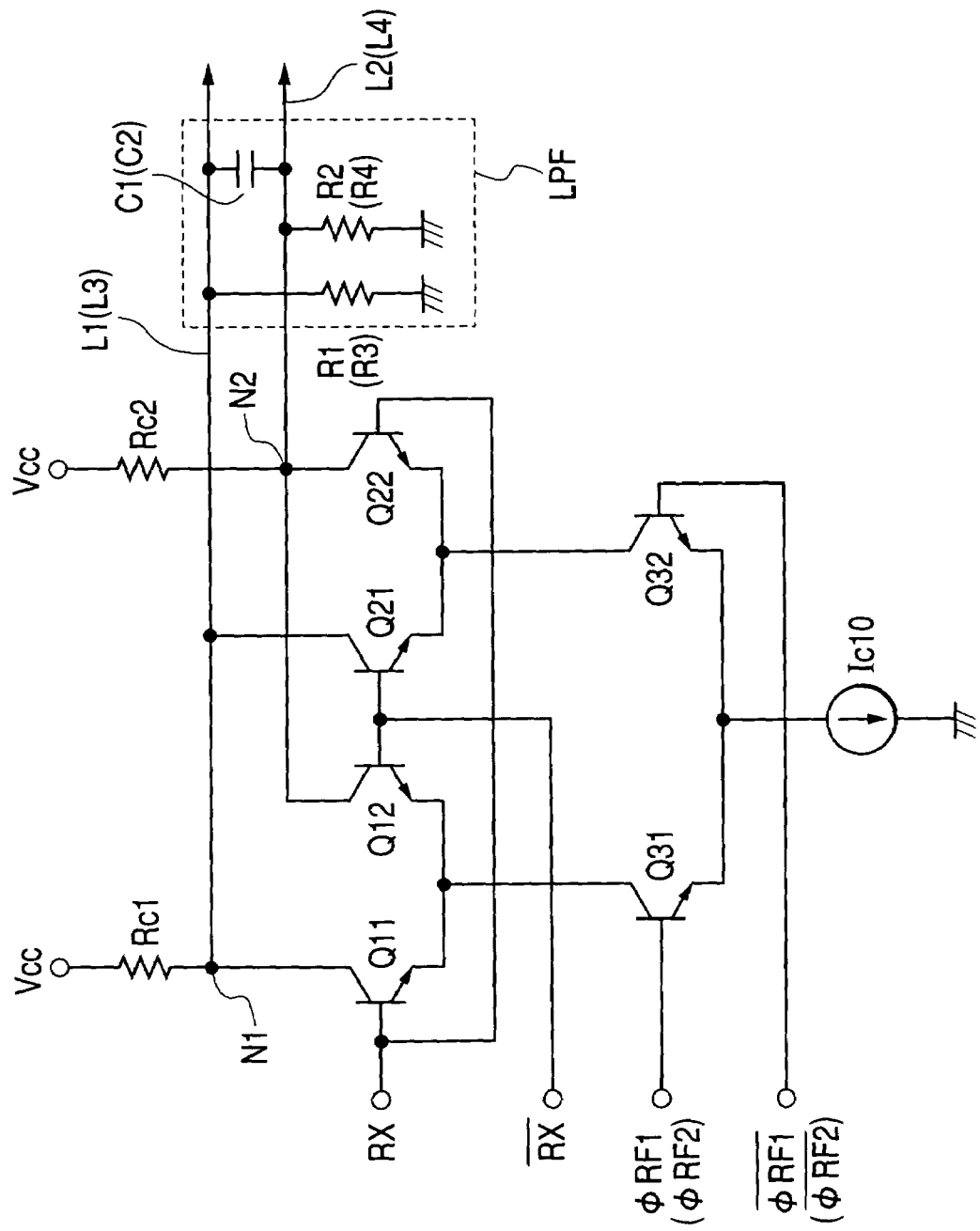
FIG. 6 is a concrete circuit diagram of the mixer.

FIG. 6 illustrates a concrete circuit example for the mixers MIXa1 through MIVb2.

As shown in FIG. 6, the mixer of this embodiment is configured with two pairs of input differential transistor pairs Q11, Q12 and Q21, Q22 of which emitters are commonly connected, a differential transistor pair Q31, Q32 of which collectors each are connected to the common emitters of these transistor pairs Q11, Q12 and Q21, Q22, of which emitters are coupled each other, a constant current source Ic10 connected to the common emitter of the transistor pair Q31, Q32, and collector resistors Rc1, Rc2 that are connected between the collectors of the transistors Q11, Q21 and the supply voltage Vcc and between the collectors of the transistors Q12, Q22 and the supply voltage Vcc. The output terminals of the mixer are connected to the low pass filter LPF, which is composed of a capacitor C1 (C2) connected between the output signal lines L1, L2 (L3, L4) and resistors R1, R2 (R3, R4) connected between the output signal lines each and the ground.

This mixer inputs a reception signal RX and an inverted signal/RX of the RX to the base terminals of the two pairs of input differential transistor pairs Q11, Q12 and Q21, Q22, and inputs the RF signals φRF1, /φRF1 (φRF2, /φRF2) supplied from the phase shifting/frequency dividing circuit 211 to the base terminals of the transistor pair Q31, Q32.

Thereby, the mixer outputs the signals that the reception signal RX and the RF signal φRF1 (φRF2) are mixed from output nodes N1, N2. The signals outputted from the nodes pass through the low pass filter LPF composed of the external capacitor C1 (C2) in FIG. 2 and the resistors R1, R2 (R3, R4), whereby the RF components are removed to generate a signal having the frequency equal to the frequency difference of the reception signal RX and the RF signal φRF1 (φRF2), and the signal is supplied to the post-stage high gain amplifier 220A (220B).

FIG. 7 and FIG. 8 illustrate waveforms to explain the function of the mixers MIXa1 through MIXb2 and the low pass filter LPF. Here, the waveforms illustrated in FIG. 7 and FIG. 8 are conceptional expressions.

Figure 7A:
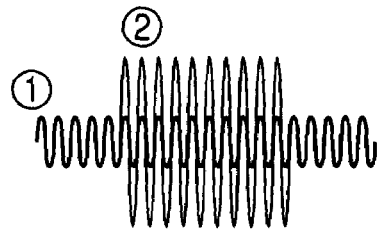
FIG. 7A illustrates a waveform of a reception signal inputted to the low noise amplifier, FIG. 7B a waveform of an output signal from the mixer, and FIG. 7C a waveform of an input signal to the high gain amplifier.
Figure 7B:
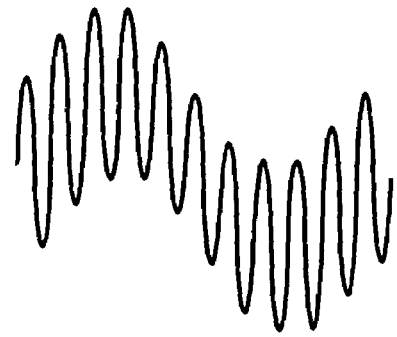
Figure 7C:
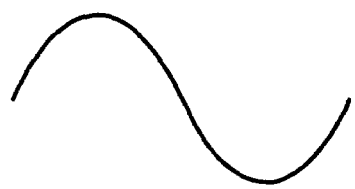
Figure 8A:
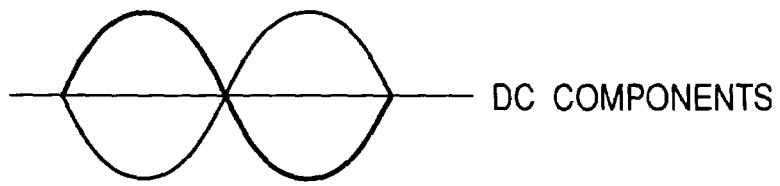
Figure 8B:
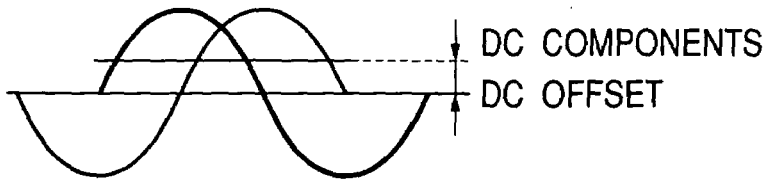

There is a possibility that the low noise amplifiers 210a through 210c input a reception signal containing a jamming wave (2) having a higher level than a desired wave (1) as shown in FIG. 7A. FIG. 7B illustrates an output waveform of any of the mixers MIXa1 through MIXb2 that contains a jamming wave. If the phases of such jamming waves are deviated from 180° between the adjacent wirings, it will cause a DC offset as shown in FIG. 8B. However, if the wirings between the mixers MIXa1 through MIXb2 and the low pass filter are scrambled as in the above embodiments, it will prevent generation of the DC offset (FIG. 8A). Here, the RF components of the jamming wave as FIG. 7B, contained in the outputs of the mixers MIXa1 through MIXb2, are removed by the function of the low pass filter LPF, and the reception signal having a desired waveform as FIG. 7C is inputted to the post-stage high gain amplifier 220.

The invention being described concretely on the basis of the embodiments, it will not be confined to the above descriptions. For example, the above embodiments assume a case that has four signal lines, however the number of the signal lines are not confined to four, and it may be five. If the number of the signal lines is N, the frequency of scrambling the signal lines should be N, or preferably (N−1).

The invention has been described with a case in which the invention is applied to the RF IC that is the applicable field as the background of the invention, which is used for the radio communication system of the mobile telephone capable of communications by the three communication systems of GSM, DCS, and PCS; however, the invention is not limited to this. For, example, the invention can be applied to the RF IC used for the mobile telephone capable of communications by the communication system called the EDGE having the QPSK modulation mode, which adds the amplitude modulation to the phase modulation in the GSM; it can also be applied to the RF IC for making up the CDMA system mobile telephone or the radio LAN or the radio communication system called the Bluetooth.

The advantages provided by the typical constituent features of the present invention disclosed in the present applicant will be described below.

That is, according to the present invention, in the modulating/demodulating RF IC for the multi-band radio communication system, since the signal lines to transmit the outputs of the plural mixers that demodulates or down-convert the reception signals of different bands are scrambled each other, influence given by one signal line at a certain position to the other adjacent signal line is given to the same adjacent signal line as a reverse influence at another position, and the influence is cancelled, so that generation of the DC offsets in the gain control amplifiers at the following stages of the mixer is prevented.

What is claimed is:

1. A semiconductor integrated circuit which receives signals of plural bands and is capable of demodulating, comprising:

plural mixers; and plural signal lines to transmit outputs of the plural mixers, the plural signal lines being provided with plural scramble areas within which the signal lines intersect each other, wherein, if the number of the signal lines to transmit the outputs of the mixers is given by N, then the total number of the scramble areas of the signal lines is determined to be N−1, where the N is equal to an integer of 4, wherein each of said plural mixers is a circuit that inputs a reception signal of a predetermined frequency and an oscillation signal of a predetermined frequency, and attains a signal of a frequency equivalent to the frequency difference of the reception signal and the oscillation signal, wherein the plural mixers include a first mixer that inputs a reception signal of a predetermined frequency and a first oscillation signal of a predetermined frequency, and a second mixer that inputs the reception signal and a second oscillation signal having 90° phase difference from the first oscillation signal, and wherein the plural signal lines include a first signal wire to carry a first signal, a second signal wire to carry an inverted signal of the first signal, a third signal wire to carry a third signal, which has a 90° phase difference from the first signal, and a fourth signal wire to carry an inverted signal of the third signal; wirings of the signal lines are laid out in a manner that the first signal wire and the second signal wire thereof run adjacently in parallel, the third signal wire and the fourth signal wire run adjacently in parallel, in one of the scramble areas, along a signal transmission direction, the first and second signal wires switch position with the third and fourth signal wires respectively, and the third and fourth signal wires switch position with the second and first signal wires, respectively.

2. The semiconductor integrated circuit according to claim 1, wherein arrays of the plural signal lines in areas divided by the scramble areas are each different in each of the areas.

* * * * *